(12) United States Patent
Yamazaki et al.

(10) Patent No.: US 11,178,758 B2
(45) Date of Patent: Nov. 16, 2021

(54) WIRING SUBSTRATE AND METHOD OF MANUFACTURING THE WIRING SUBSTRATE

(71) Applicant: Seiko Epson Corporation, Tokyo (JP)

(72) Inventors: Yutaka Yamazaki, Shiojiri (JP); Makoto Kato, Shiojiri (JP)

(73) Assignee: Seiko Epson Corporation

( * ) Notice: Subject to any disclaimer, the term of this patent is extended or adjusted under 35 U.S.C. 154(b) by 49 days.

(21) Appl. No.: 16/517,735

(22) Filed: Jul. 22, 2019

(65) Prior Publication Data

US 2020/0029430 A1    Jan. 23, 2020

(30) Foreign Application Priority Data

Jul. 23, 2018    (JP) .............................. JP2018-137484

(51) Int. Cl.
*H05K 1/05*    (2006.01)
*H05K 3/00*    (2006.01)

(52) U.S. Cl.
CPC ........... *H05K 1/056* (2013.01); *H05K 3/0014* (2013.01); *H05K 2203/0716* (2013.01); *H05K 2203/107* (2013.01)

(58) Field of Classification Search
CPC .............................................. H05K 2203/1173
See application file for complete search history.

(56) References Cited

U.S. PATENT DOCUMENTS 6,770,369 B1 *    8/2004    Oyamada ................ C23C 18/36
428/403

FOREIGN PATENT DOCUMENTS

JP    2012-136769 A    7/2012

OTHER PUBLICATIONS

Machine translation of JP2012136769A (Year: 2012).*

* cited by examiner

*Primary Examiner* — Ian A Rummel
(74) *Attorney, Agent, or Firm* — Harness, Dickey & Pierce, P.L.C.

(57) ABSTRACT

A wiring substrate at which a metal wire is formed includes a substrate containing a resin as a main component and an organic substance having a hydroxyl group; and a metal plating layer constituting the metal wire. A formation portion of the metal wire at one surface of the substrate is rougher than a non-formation portion of the metal wire at the one surface of the substrate, and has the organic substance in a state of being embedded in the resin, and a catalyst. The wiring substrate with such a configuration can increase the adhesion of the metal wire to the substrate.

5 Claims, 4 Drawing Sheets

WIRING SUBSTRATE AND METHOD OF MANUFACTURING THE WIRING SUBSTRATE

The present application is based on, and claims priority from, JP Application Serial Number 2018-137484, filed Jul. 23, 2018, the disclosure of which is hereby incorporated by reference herein in its entirety.

BACKGROUND

1. Technical Field

The present disclosure relates to a wiring substrate and a method of manufacturing the wiring substrate.

2. Related Art

Various wiring substrates have been used. A metal wire, which is a wire made of a metal, is formed at such a wiring substrate.

For example, JP-A-2012-136769 discloses a method of manufacturing a molded circuit component which is a wiring substrate, the method including irradiating a base body made of a synthetic resin and serving as a substrate with a laser beam to modify its surface, and bringing an ion catalyst into contact with the surface modified portion to provide electroless plating at the portion, thereby forming a metal wire.

The method of manufacturing the molded circuit component disclosed in JP-A-2012-136769 irradiates the synthetic resin base body with a laser beam to modify its surface, and brings the ion catalyst into contact with the surface modified portion. However, the surface modification by bringing the ion catalyst into contact with the surface modified portion merely applies the ion catalyst to the surface of the synthetic resin base body. The metal wire formed by electroless plating may not have sufficient adhesion to the base body.

SUMMARY

According to an aspect of the disclosure, to address the above-described problem, a wiring substrate at which a metal wire is formed includes a substrate containing a resin as a main component and an organic substance having a hydroxyl group; and a metal plating layer constituting the metal wire. A formation portion of the metal wire at one surface of the substrate is rougher than a non-formation portion of the metal wire at the one surface of the substrate, and has the organic substance in a state of being embedded in the resin, and a catalyst.

DESCRIPTION OF EXEMPLARY EMBODIMENTS

Figure 1:
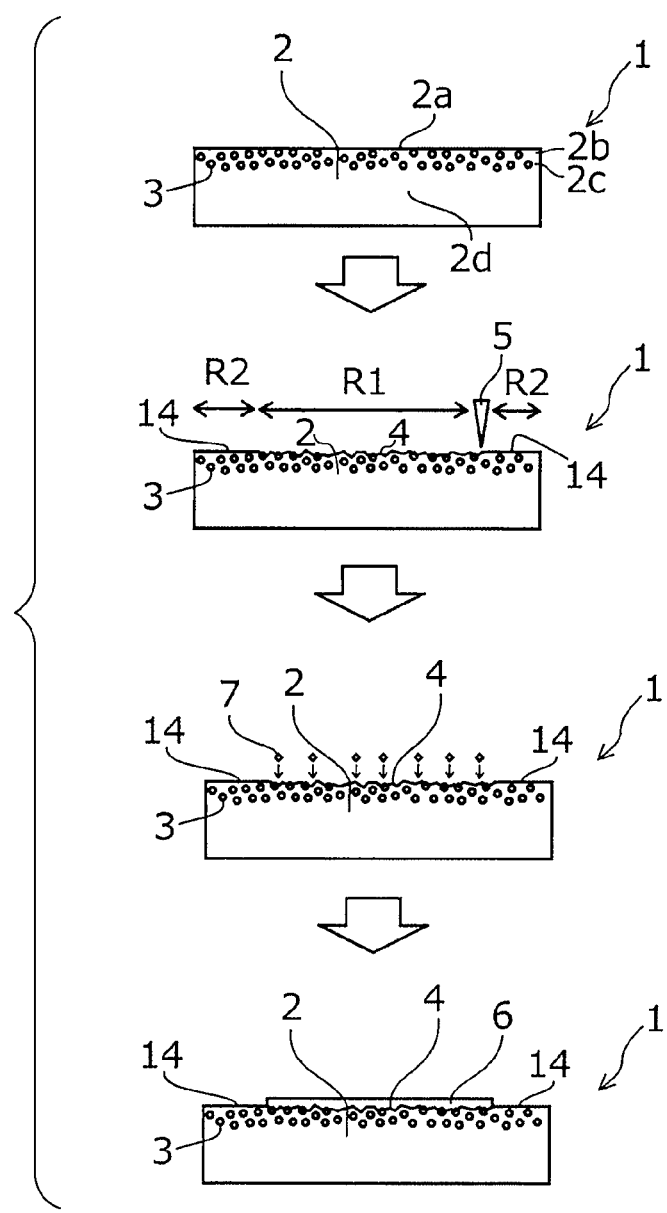
FIG. 1 is a schematic diagram for explaining a wiring substrate and a method of manufacturing the wiring substrate according to a first embodiment of the disclosure.

First, the disclosure will be briefly described.

According to a first aspect of the disclosure, to address the above-described problem, a wiring substrate at which a metal wire is formed includes a substrate containing a resin as a main component and an organic substance having a hydroxyl group; and a metal plating layer constituting the metal wire. A formation portion of the metal wire at one surface of the substrate is rougher than a non-formation portion of the metal wire at the one surface of the substrate, and has the organic substance in a state of being embedded in the resin, and a catalyst.

With the aspect, the metal plating layer as the metal wire is disposed at a position rougher than the non-formation portion of the metal wire. That is, since the metal plating layer is disposed at the position rougher than the non-formation portion of the metal wire, the adhesion of the metal wire to the substrate is increased. Furthermore, the metal plating layer is disposed at a position provided with the organic substance in the state of being embedded in the resin, and the catalyst. That is, since the hydroxyl group of the organic substance in the state of being embedded in the resin of the substrate is chemically bonded to the catalyst, metal plating is provided by using the catalyst bonded to the organic substance in the state of being embedded in the resin of the substrate. Thus, metal plating is provided by using not just the catalyst applied to the one surface of the substrate, but the organic substance in the state of being embedded in the resin of the substrate and the catalyst, thereby increasing the adhesion of the metal wire to the substrate.

In this case, "the catalyst" represents a catalyst for performing a precipitation reaction of the metal when the metal plating layer is formed. Also, "being rougher" represents a situation that the adhesion of the metal plating layer is increased at a roughened position in the one surface of the substrate than a non-roughened position in the one surface of the substrate. Thus, "being rougher" also includes a situation in which the one surface of the substrate is roughened in advance and a portion without the metal plating layer is flattened. Further, when comparing the roughness of the formation portion of the metal wire at the one surface of the substrate with that of the non-formation portion of the metal wire at the one surface of the substrate, the roughness is numerically expressed by using parameters indicating a roughness such as an arithmetic mean roughness (Ra) or a root-mean-square roughness (Rms) based on information obtained from a sectional image of the substrate obtained by using a microscope or information obtained through a measurement for the roughness of the one surface of the substrate in a contact or non-contact manner (an atomic force microscope (AFM), a scanning probe microscope (SPM), a laser microscope, an ultrasonic non-destructive method, etc.).

According to a second aspect of the disclosure, in the wiring substrate based on the first aspect, a volume density of the organic substance in an area near the one surface of the substrate may be higher than a volume density of the organic substance in an area near a center of the substrate in a thickness direction of the substrate.

With the aspect, since the volume density of the organic substance in the area near the one surface of the substrate is higher than the volume density of the organic substance in the area near the center of the substrate in the thickness direction of the substrate, the amount of the organic substance in the state of being embedded in the resin of the substrate can be effectively increased, and the adhesion of the metal wire to the substrate can be increased.

According to a third aspect of the disclosure, a wiring substrate at which a metal wire is formed includes a substrate having a resin as a main component; and a metal plating layer constituting the metal wire. The substrate has a metal particle obtained by coating an organic substance having a hydroxyl group with a metal. The metal particle in a formation portion of the metal wire at one surface of the substrate is in a state of being embedded in the resin.

With the aspect, the substrate has the metal particle obtained by coating the organic substance having the hydroxyl group with the metal, and the metal particle in the state of being embedded in the substrate causes precipitation of the metal to form the metal plating layer. Accordingly, the adhesion of the metal wire to the substrate can be increased.

According to a fourth aspect of the disclosure, in the wiring substrate based on the third aspect, the formation portion of the metal wire at the one surface of the substrate may be rougher than a non-formation portion of the metal wire at the one surface of the substrate.

With the aspect, the metal plating layer as the metal wire is disposed at a position rougher than the non-formation portion of the metal wire. That is, since the metal plating layer is disposed at the position rougher than the non-formation portion of the metal wire, the adhesion of the metal wire to the substrate is increased.

According to a fifth aspect of the disclosure, in the wiring substrate based on the third or fourth aspect, a volume density of the metal particle in an area near the one surface of the substrate may be higher than a volume density of the metal particle in an area near a center of the substrate in a thickness direction of the substrate.

With the aspect, since the volume density of the metal particle in the area near the one surface of the substrate is higher than the volume density of the metal particle in the area near the center of the substrate in the thickness direction of the substrate, the amount of the metal particle in the state of being embedded in the resin of the substrate can be effectively increased, and the adhesion of the metal wire to the substrate can be increased.

According to a sixth aspect of the disclosure, a method of manufacturing a wiring substrate includes a substrate molding step of molding a substrate by using a material containing a resin as a main component and an organic substance having a hydroxyl group; a laser irradiation step of irradiating the substrate with a laser beam; a catalyst applying step of applying a catalyst to a laser irradiation region of the substrate; and a metal plating step of providing metal plating in the laser irradiation region of the substrate to which the catalyst was applied.

With the aspect, metal plating as the metal wire is formed in the laser irradiation region. That is, metal plating is formed at a position roughened by the laser beam, and hence the adhesion of the metal wire to the substrate is increased. Furthermore, metal plating is formed at a position to be exposed by the irradiation with the laser beam and provided with the organic substance in the state of being embedded in the resin. Since the hydroxyl group of the organic substance in the state of being embedded in the resin of the substrate is chemically bonded to the catalyst, metal plating is provided by using the catalyst bonded to the organic substance in the state of being embedded in the resin of the substrate. Thus, metal plating is provided by using not just the catalyst applied to the one surface of the substrate, but the organic substance in the state of being embedded in the resin of the substrate and the catalyst, thereby increasing the adhesion of the metal wire to the substrate.

According to a seventh aspect of the disclosure, in the method for manufacturing the wiring substrate based on the sixth aspect, the substrate molding step may inject the material into a mold, adjust a mold clamping force to the mold, and hence form a surface layer and an inner layer; and the laser irradiation step may ablate the resin in the surface layer to expose the organic substance contained in the inner layer.

With the aspect, since the resin in the surface layer is ablated to expose the organic substance contained in the inner layer, the amount of the organic substance in the state of being embedded in the resin of the substrate can be effectively increased, and the adhesion of the metal wire to the substrate can be increased.

According to an eighth aspect of the disclosure, a method of manufacturing a wiring substrate includes a precipitation step of precipitating a metal ion in an aqueous solution containing the metal ion, an organic substance, and a catalyst to obtain a metal particle; a kneading step of kneading the metal particle and the resin; a substrate molding step of molding a substrate by using a material kneaded in the kneading step; a laser irradiation step of irradiating the substrate with a laser beam; and a metal plating step of providing metal plating in a laser irradiation region of the substrate.

With the aspect, metal plating as the metal wire is formed in the laser irradiation region. That is, metal plating is formed at a position roughened by the laser beam, and hence the adhesion of the metal wire to the substrate is increased. Furthermore, metal plating is formed at a position to be exposed by the irradiation with the laser beam and provided with the metal particle in the state of being embedded in the resin. Metal is precipitated for the metal particle in the state of being embedded in the resin of the substrate, and metal plating is provided. Accordingly, metal plating is provided by using the metal particle in the state of being embedded in the resin of the substrate. Thus, the adhesion of the metal wire to the substrate can be increased.

The metal constituting the metal particle does not have to be the same as the metal used for metal plating; however, the same metal may be used.

A wiring substrate and a method of manufacturing the wiring substrate according to embodiments of the disclosure will now be described in detail with reference to the accompanying drawings.

Figure 2:
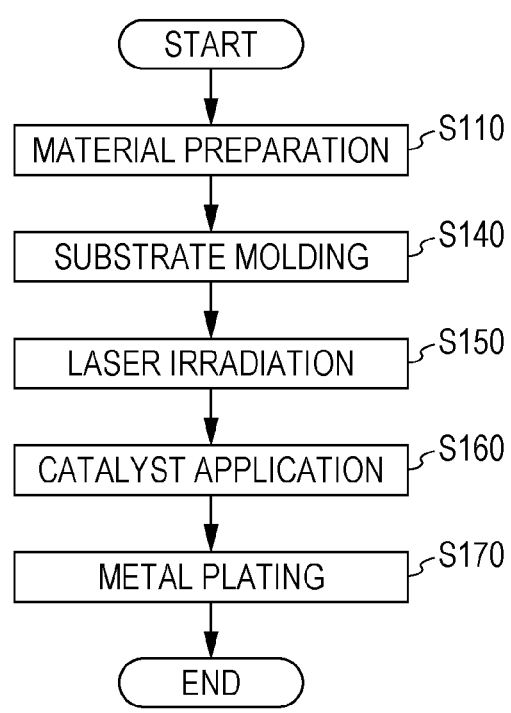
FIG. 2 is a flow chart of the method of manufacturing the wiring substrate according to the first embodiment of the disclosure.

First Embodiment (FIG. 1 and FIG. 2)

A wiring substrate 1 and a method of manufacturing the wiring substrate 1 according to a first embodiment of the disclosure will now be described with reference to FIGS. 1 and 2. FIG. 1 illustrates a manufacturing process of the wiring substrate 1 from the top sub-figure indicating a manufacturing start state of the wiring substrate 1 to the bottom sub-figure indicating a completed state thereof. The wiring substrate 1 in this embodiment is a wiring substrate at which a metal wire is formed. For example, copper may be suitably used as the metal used for the metal wire; however, the metal is not limited to copper.

First, to form a substrate 2 illustrated in the top sub-figure in FIG. 1 and the other figures, a material constituting the substrate 2 is prepared in a material preparation step in step S110 in FIG. 2. The material contains a resin which is a main component and an organic substance having the hydroxyl group. Examples of the organic substance having a hydroxyl group include cellulose nanofibers 3; however, are not limited to the cellulose nanofibers 3. In this specification, "a main component" represents a component occupying 50% or more of components constituting a material of such a substrate, or a component occupying the highest proportion of the material.

After the material constituting the substrate 2 is prepared, the substrate 2 is molded in a substrate molding step in step S120 in FIG. 2, as illustrated in the top sub-figure in FIG. 1. Specifically, for example, the material prepared in the material preparation step is injected into a mold. When the material is injected into the mold, by adjusting the mold clamping force to the mold, a surface layer 2b and an inner layer 2c formed below the surface layer 2b (the side opposite to the surface side) can be formed in the vicinity of a surface 2a serving as one surface of the substrate 2 as illustrated in the top sub-figure in FIG. 1. Further, the volume density of the cellulose nanofibers 3 in an area near the surface 2a can be higher than the volume density thereof in an area near a center 2d of the substrate 2 in the thickness direction of the substrate 2 as illustrated in the top sub-figure in FIG. 1.

Next, for the wiring substrate 1 in the state illustrated in the top sub-figure in FIG. 1, a laser irradiation region R1 is irradiated with a laser beam 5 as illustrated in the second sub-figure from the top of FIG. 1. The laser irradiation region R1 serves as a metal-wiring formation portion 4 which is a portion of the surface 2a of the substrate 2. By the irradiation with the laser beam 5, the surface 2a of the metal-wiring formation portion 4 is roughened and hence modified, and the resin of the surface layer 2b is ablated and hence the cellulose nanofibers 3 included in the inner layer 2c are exposed, thereby exposing the cellulose nanofibers 3 from the substrate 2. That is, the metal-wiring formation portion 4 is formed with unevenness at the surface 2a and the cellulose nanofibers 3 are in a state of being embedded in the resin of the substrate 2. Describing in the viewpoint of the method of manufacturing the wiring substrate 1 in this embodiment, this step corresponds to a laser irradiation step indicated in step S150 in FIG. 2.

Next, for the wiring substrate 1 in the state illustrated in the second sub-figure from the top of FIG. 1, the catalyst 7 is applied to the surface 2a of the substrate 2 as illustrated in the third sub-figure from the top of FIG. 1. Describing in the viewpoint of the method of manufacturing the wiring substrate 1 in this embodiment, this step corresponds to a catalyst application step indicated in step S160 in FIG. 2. As the catalyst 7, for example, palladium ions may be used. When copper is used as the metal used for the metal wire, palladium ions have an excellent advantageous effect of the catalyst 7, and hence palladium ions can be suitably used as the catalyst 7; however, the catalyst 7 is not limited to palladium ions. Any cationic catalyst capable of being chemically bonded to an organic substance having a hydroxyl group, such as cellulose nanofibers, may be used. When the catalyst 7 is cationic, the catalyst 7 is chemically bonded to the cellulose nanofibers 3 exposed from the surface 2a of the substrate 2 in the metal-wiring formation portion 4. The method of applying the catalyst 7 to the surface 2a of the substrate 2 can be performed by applying an aqueous solution or the like containing the catalyst 7 to the surface 2a of the substrate 2, or immersing the substrate 2 in an aqueous solution or the like containing the catalyst 7; however, is not particularly limited thereto.

Then, for the wiring substrate 1 in the state illustrated in the third sub-figure from the top of FIG. 1, metal plating constituting a metal wiring is provided in the laser irradiation region R1, serving as the metal-wiring formation portion 4, to form a metal plating layer 6 as illustrated in the bottom sub-figure in FIG. 1. Describing in the viewpoint of the method of manufacturing the wiring substrate 1 in this embodiment, this step corresponds to a metal plating step indicated in step S170 in FIG. 2. Although there is no particular limitation on the specific method of forming the metal plating layer 6 serving as the metal wire, electroless plating may be suitably performed, and for example, a method of immersing the wiring substrate 1 in an aqueous solution or the like containing the metal ions constituting the metal wire may be performed. Specifically, for example, when the metal constituting the metal wire is a copper-nickel alloy, the wiring substrate 1 in the state illustrated in the third sub-figure from the top of FIG. 1 is immersed in an electroless copper-nickel plating solution, and the copper-nickel alloy is precipitated by using, as a core, palladium as the catalyst 7.

In short, the wiring substrate 1 of this embodiment illustrated in the bottom sub-figure in FIG. 1 is the wiring substrate at which the metal wire is formed, and includes the substrate 2 containing the resin as the main component and the cellulose nanofibers 3, and the metal plating layer 6 constituting the metal wire. The metal-wiring formation portion 4 at the surface 2a of the substrate 2 is rougher than a metal-wiring non-formation portion 14 at the surface 2a of the substrate 2, and has the cellulose nanofibers 3 in the state of being embedded in the resin of the substrate 2, and the catalyst 7.

In the wiring substrate 1 of this embodiment illustrated in the bottom sub-figure in FIG. 1, the metal plating layer 6 serving as the metal wire is disposed at a position rougher than the metal-wiring non-formation portion 14. That is, since the metal plating layer 6 is disposed at the position rougher than the metal-wiring non-formation portion 14, the adhesion of the metal wire to the substrate 2 is increased. Furthermore, the metal plating layer 6 is disposed at a position provided with the cellulose nanofibers 3 in the state of being embedded in the resin and the catalyst 7. That is, since the cellulose nanofibers 3 in the state of being embedded in the resin of the substrate 2 is chemically bonded to the catalyst, metal plating is provided by using the catalyst 7 bonded to the cellulose nanofibers 3 in the state of being embedded in the resin of the substrate 2. Thus, in the wiring substrate 1 of this embodiment, metal plating is provided by using not just the catalyst 7 applied to the surface 2a of the substrate 2, but the cellulose nanofibers 3 in the state of being embedded in the resin of the substrate 2 and the catalyst 7, thereby increasing the adhesion of the metal wire to the substrate 2. Note that "the metal-wiring formation portion 4" is "rougher than the metal-wiring non-formation portion 14" includes, in addition to "a state in which the metal-wiring formation portion 4 is formed by roughening the metal-wiring formation portion 4", "a state in which the metal-wiring formation portion 4 is relatively rougher than the metal-wiring non-formation portion 14" by planarizing the metal-wiring non-formation portion 14 more than the metal-wiring formation portion 4 even without roughening the metal-wiring formation portion 4.

As described above, in the wiring substrate 1 of this embodiment, the volume density of the cellulose nanofibers 3 in the area near the surface 2a is higher than the volume density thereof in the area near the center 2d of the substrate 2 in the thickness direction of the substrate 2. Thus, in the wiring substrate 1 of this embodiment, the amount of cellulose nanofibers 3 in the state of being embedded in the resin of the substrate 2 can be effectively increased, and the adhesion of the metal wire to the substrate 2 can be increased.

In the viewpoint of the method of manufacturing the wiring substrate 1 of this embodiment, the method of manufacturing the wiring substrate 1 of this embodiment includes the substrate molding step in step S140 of molding the substrate 2 by using the material containing the resin as the main component and the cellulose nanofibers 3; the laser irradiation step in step S150 of irradiating the portion of the surface 2a of the substrate 2 with the laser beam 5; the catalyst application step in step S160 of applying the catalyst 7 to the laser irradiation region R1 of the substrate 2; and the metal plating step in step S170 of providing metal plating in the laser irradiation region R1 applied with the catalyst 7 at the substrate 2.

In the method of manufacturing the wiring substrate 1 of this embodiment, metal plating as the metal wire is formed in the laser irradiation region R1. That is, metal plating is formed at a position roughened by the laser beam 5, and hence the adhesion of the metal wire to the substrate 2 is increased. Furthermore, metal plating is formed at a position to be exposed by the irradiation with the laser beam 5 and provided with the cellulose nanofibers 3 in the state of being embedded in the resin. Then, since the hydroxyl group of the cellulose nanofibers 3 in the state of being embedded in the resin of the substrate 2 is chemically bonded to the catalyst 7, metal plating is provided by using the catalyst 7 bonded to the cellulose nanofibers 3 in the state of being embedded in the resin of the substrate 2. Thus, by performing the method of manufacturing the wiring substrate 1 of this embodiment, metal plating is provided by using not just the catalyst 7 applied to the surface 2a of the substrate 2, but the cellulose nanofibers 3 in the state of being embedded in the resin of the substrate 2 and the catalyst 7, thereby increasing the adhesion of the metal wire to the substrate 2.

In addition, in the substrate molding step in step S140, by injecting the material constituting the substrate 2 into the mold and adjusting the mold clamping force to the mold as described above, the surface layer 2b and the inner layer 2c can be formed as illustrated in the top sub-figure in FIG. 1. In the laser irradiation step in step S150, the resin of the surface layer 2b is ablated to expose the cellulose nanofibers 3 included in the inner layer 2c. Thus, by performing the method of manufacturing the wiring substrate 1 of this embodiment, the cellulose nanofibers 3 in the state of being embedded in the resin of the substrate 2 can be effectively formed, and the adhesion of the metal wire to the substrate 2 can be increased.

Figure 3:
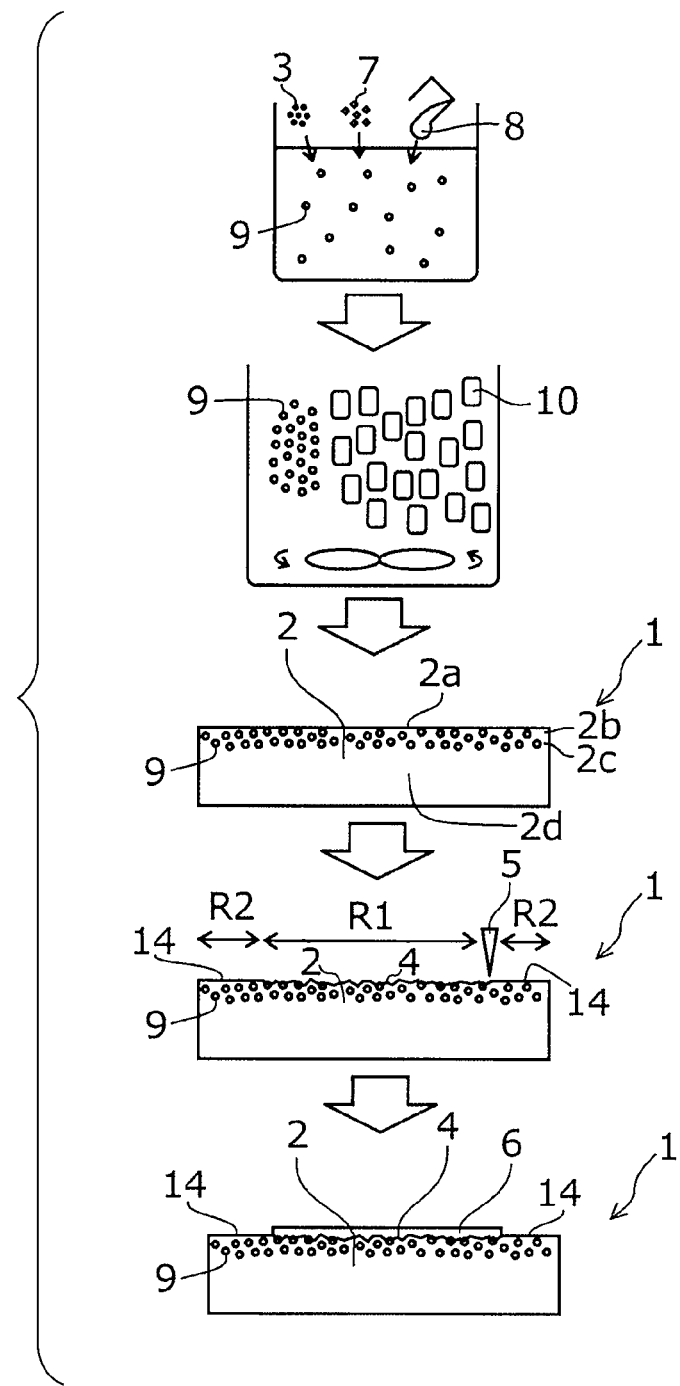
FIG. 3 is a schematic diagram for explaining a wiring substrate and a method of manufacturing the wiring substrate according to a second embodiment of the disclosure.
Figure 4:
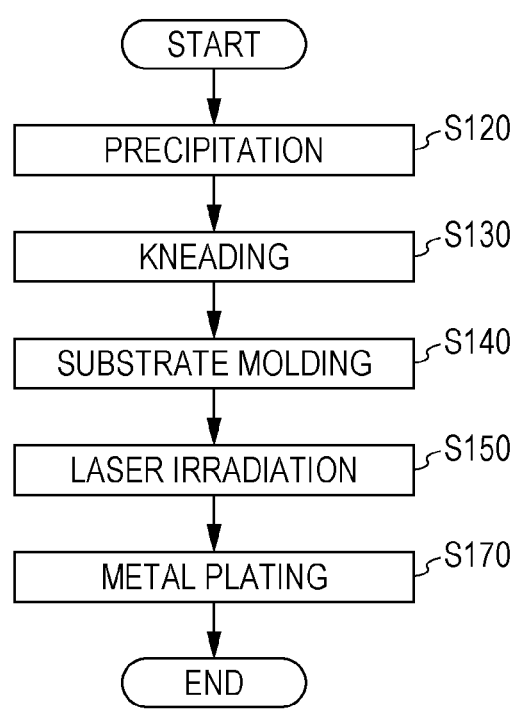
FIG. 4 is a flow chart of the method of manufacturing the wiring substrate according to the second embodiment of the disclosure.

Second Embodiment (FIG. 3 and FIG. 4)

Next, a wiring substrate 1 and a method of manufacturing the wiring substrate 1 according to a second embodiment of the disclosure will now be described with reference to FIGS. 3 and 4. The wiring substrate 1 in this embodiment is a wiring substrate at which a metal wire is formed similarly to the wiring substrate 1 of the first embodiment. For example, copper may be suitably used as the metal used for the metal wire; however, the metal is not limited to copper.

FIG. 3 is a diagram corresponding to FIG. 1 of the wiring substrate 1 according to the first embodiment, and FIG. 4 is a diagram corresponding to FIG. 2 of the method of manufacturing the wiring substrate 1 according to the first embodiment. Components common to those in the first embodiment are denoted by the same reference numerals, and the detailed description thereof will be omitted.

First, a precipitation step indicated in step S120 in FIG. 4 is performed. Specifically, to form a substrate 2 illustrated in the third sub-figure from the top of FIG. 3, metal particles 9 are precipitated by mixing cellulose nanofibers 3 as an organic substance having a hydroxyl group, a catalyst 7, and a metal-ion containing liquid 8 as a main component of the metal particles 9 to be precipitated, as illustrated in the top sub-figure in FIG. 3. More specifically, the cellulose nanofibers 3, the catalyst 7, and the metal-ion containing liquid 8 are put into a container containing pure water, and the mixture is stirred. Then, the catalyst 7 is chemically bonded to the cellulose nanofibers 3, and the metal ions are precipitated while coating the cellulose nanofibers 3 by using the catalyst 7. Note that the metal contained in the metal-ion containing liquid 8 is desirably the same as the metal used for metal plating as described later; however, is not limited to the metal used for metal plating.

Next, as illustrated in the second sub-figure from the top of FIG. 3, the metal particles 9 precipitated in the precipitation step in step S120 and pellets 10 constituted of a resin which is a main component of the substrate 2 are kneaded in the container. Describing in the viewpoint of the method of manufacturing the wiring substrate 1 in this embodiment, this step corresponds to a kneading step indicated in step S130 in FIG. 4.

Next, as illustrated in the third sub-figure from the top of FIG. 3, the substrate 2 is molded in a substrate molding step in step S140 of FIG. 4 by using the material kneaded in the kneading step in step S130. Specifically, the material kneaded in the kneading step is injected into a mold similarly to the substrate molding step according to the first embodiment. Similarly to the substrate molding step according to the first embodiment, by adjusting the mold clamping force to the mold when the material is injected into the mold, a surface layer 2b, and an inner layer 2c formed below the surface layer 2b can be formed in the vicinity of a surface 2a of the substrate 2 as illustrated in the third sub-figure from the top of FIG. 3. Further, the volume density of the metal particles 9 in an area near the surface 2a of the substrate 2 can be higher than the volume density thereof in an area near the center 2d of the substrate 2 in the thickness direction of the substrate 2 as illustrated in the third sub-figure from the top of FIG. 3.

Next, for the wiring substrate 1 in the state illustrated in the third sub-figure from the top of FIG. 3, a laser irradiation region R1, as a metal-wiring formation portion 4 which is a portion of the surface 2a of the substrate 2, is irradiated with a laser beam 5 as illustrated in the fourth sub-figure from the top of FIG. 3. By the irradiation with the laser beam 5, the surface 2a of the metal-wiring formation portion 4 is roughened and hence modified, and the resin of the surface layer 2b is ablated and hence the metal particles 9 contained in the inner layer 2c are exposed, thereby exposing the metal particles 9 from the substrate 2. That is, the metal-wiring formation portion 4 is formed with unevenness at the surface 2a and the metal particles 9 are in the state of being embedded in the resin of the substrate 2. Describing in the viewpoint of the method of manufacturing the wiring substrate 1 in this embodiment, this step corresponds to a laser irradiation step indicated in step S150 in FIG. 4.

Then, for the wiring substrate 1 in the state illustrated the fourth sub-figure from the top of FIG. 3, metal plating constituting a metal wire is provided in the laser irradiation region R1 as the metal-wiring formation portion 4 to form a metal plating layer 6 as illustrated in the bottom sub-figure in FIG. 3. Describing in the viewpoint of the method of manufacturing the wiring substrate 1 of this embodiment, this step corresponds to a metal plating step indicated in step S170 in FIG. 4, and is similar to the metal plating step in the method of manufacturing the wiring substrate 1 according to the first embodiment.

The wiring substrate 1 of this embodiment illustrated in the bottom sub-figure in FIG. 3 is the wiring substrate at which the metal wire is formed, and includes the substrate 2 containing the resin as the main component, and the metal plating layer 6 constituting the metal wire. As described above, the substrate 2 has the metal particles 9 in which the cellulose nanofibers 3 are coated with the metal, and the metal-wiring formation portion 4 at the surface 2a of the substrate 2 is in the state in which the metal particles 9 are embedded in the resin. In other words, in the wiring substrate 1 of this embodiment, the metal is precipitated for the metal particles 9 in the state of being embedded in the substrate 2 to form the metal plating layer 6. Thus, the adhesion of the metal wire to the substrate 2 is increased.

In other words, in the wiring substrate 1 of this embodiment, the metal-wiring formation portion 4 at the surface 2a of the substrate 2 contains the cellulose nanofibers 3 and the catalyst 7, and has the metal particles 9 in the state of being embedded in the resin. With such a configuration, metal plating is provided by using the metal particles 9 in the state of being embedded in the resin of the substrate 2. Thus, the wiring substrate 1 of this embodiment increases the adhesion of the metal wire to the substrate 2.

In the wiring substrate 1 of this embodiment, as illustrated in the fourth sub-figure from the top of FIG. 3, the metal-wiring formation portion 4 at the surface 2a of the substrate 2 is made rougher than a metal-wiring non-formation portion 14 at the surface 2a of the substrate 2 by a laser irradiation step indicated in step S150 in FIG. 4. In other words, as illustrated in the bottom sub-figure in FIG. 3, the metal plating layer 6 serving as the metal wire is disposed at a position rougher than the metal-wiring non-formation portion 14. That is, regarding the wiring substrate 1 of this embodiment, since the metal plating layer 6 is disposed at the position rougher than the metal-wiring non-formation portion 14, the adhesion of the metal wire to the substrate 2 is increased.

As described above, in the wiring substrate 1 of this embodiment, the volume density of the metal particles 9 in the area near the surface 2a of the substrate 2 is higher than the volume density thereof in the area near the center 2d of the substrate 2 in the thickness direction of the substrate 2. Thus, in the wiring substrate 1 of this embodiment, the amount of metal particles 9 in the state of being embedded in the resin of the substrate 2 can be effectively increased, and the adhesion of the metal wire to the substrate 2 can be increased.

The method of manufacturing the wiring substrate 1 of this embodiment includes the precipitation step in step S120 of precipitating the metal ions in the aqueous solution containing the metal ions, the cellulose nanofibers 3, and the catalyst 7 and obtaining the metal particles 9; the kneading step in step S130 of kneading the metal particles 9 and the resin that is the pellets 10; the substrate molding step in step S140 of molding the substrate 2 using the material kneaded in the kneading step; the laser irradiation step in S150 of irradiating the portion of the surface 2a of the substrate 2 with the laser beam 5; and the metal plating step in step S170 of providing metal plating in the laser irradiation region R1 of the substrate 2.

In the method of manufacturing the wiring substrate 1 of this embodiment, metal plating as the metal wire is formed in the laser irradiation region R1. That is, metal plating is formed at a position roughened by the laser beam 5, and hence the adhesion of the metal wire to the substrate 2 is increased. Furthermore, metal plating is formed at a position to be exposed by the irradiation with the laser beam 5 and provided with the metal particles 9 in the state of being embedded in the resin. Metal is precipitated for the metal particles 9 in the state of being embedded in the resin of the substrate 2, and metal plating is provided. Accordingly, metal plating is provided by using the metal particles 9 in the state of being embedded in the resin of the substrate 2. Thus, by performing the method of manufacturing the wiring substrate 1 of this embodiment, the adhesion of the metal wire to the substrate 2 can be increased.

The metal constituting the metal particles 9 and precipitated in the precipitation step does not have to be the same as the metal used for metal plating in the metal plating step; however, the same metal may be used.

It is to be understood that the disclosure is not limited to the above-described embodiments, and various modifications may be made within the scope of the disclosure described in the claims, and that they are included within the scope of the disclosure.

What is claimed is:

1. A wiring substrate at which a metal wire is formed, comprising:
   a substrate containing a resin as a main component, and
      a first layer of particles of an organic substance having a hydroxyl group located beneath a surface of the substrate and a second layer of the particles of the organic substance located beneath the first layer such that the first layer is closer to the surface than the second layer; and
   a metal plating layer constituting the metal wire, wherein
   a formation portion of the substrate that includes the metal wire
      is rougher than a non-formation portion of the substrate that does not include the metal wire, and
      has the organic substance in a state of being embedded in the resin, and a catalyst.

2. The wiring substrate according to claim 1, wherein a volume density of the organic substance in an area near the surface of the substrate is higher than a volume density of the organic substance in an area near a center of the substrate in a thickness direction of the substrate.

3. A wiring substrate at which a metal wire is formed, comprising:
   a substrate having a resin as a main component; and
   a metal plating layer constituting the metal wire, wherein
   the substrate has a first layer of metal particles located beneath a surface of the substrate and a second layer of the metal particles located beneath the first layer such that the first layer is closer to the surface than the second layer, the metal particles each being obtained by coating an organic substance having a hydroxyl group with a metal, and
   the metal particles in a formation portion at the surface of the substrate where the metal wire is formed are embedded in the resin.

4. The wiring substrate according to claim 3, wherein the formation portion of the substrate is rougher than a non-formation portion of the substrate at the surface of the substrate that does not include the metal wire.

5. The wiring substrate according to claim 3, wherein a volume density of the metal particle in an area near the surface of the substrate is higher than a volume density of the metal particle in an area near a center of the substrate in a thickness direction of the substrate.

\* \* \* \* \*